United States Patent
Noh et al.

(10) Patent No.: US 9,593,260 B2
(45) Date of Patent: Mar. 14, 2017

(54) CMP SLURRY COMPOSITION FOR POLISHING COPPER, AND POLISHING METHOD USING SAME

(71) Applicant: CHEIL INDUSTRIES, INC., Gumi-si, Gyeongsangbuk-do (KR)

(72) Inventors: Jong Il Noh, Uiwang-si (KR); Dong Hun Kang, Uiwang-si (KR); Tae Wan Kim, Uiwang-si (KR); Jeong Hwan Jeong, Uiwang-si (KR); Young Nam Choi, Uiwang-si (KR); Chang Ki Hong, Uiwang-si (KR)

(73) Assignee: CHEIL INDUSTRIES, INC., Gumi-Si, Gyeongsangbuk-Do (KR)

( * ) Notice: Subject to any disclaimer, the term of this patent is extended or adjusted under 35 U.S.C. 154(b) by 0 days.

(21) Appl. No.: 14/758,428

(22) PCT Filed: Jun. 21, 2013

(86) PCT No.: PCT/KR2013/005485
§ 371 (c)(1),
(2) Date: Jun. 29, 2015

(87) PCT Pub. No.: WO2014/104504
PCT Pub. Date: Jul. 3, 2014

(65) Prior Publication Data
US 2016/0017181 A1    Jan. 21, 2016

(30) Foreign Application Priority Data
Dec. 31, 2012  (KR) .......................... 10-2012-0158160

(51) Int. Cl.
*C09G 1/02* (2006.01)
*H01L 21/321* (2006.01)
*C09K 3/14* (2006.01)

(52) U.S. Cl.
CPC .............. *C09G 1/02* (2013.01); *C09K 3/1463* (2013.01); *H01L 21/3212* (2013.01)

(58) Field of Classification Search
None
See application file for complete search history.

(56) References Cited

U.S. PATENT DOCUMENTS

| 7,183,211 | B2* | 2/2007 | Konno | ................ H01L 21/3212 257/E21.304 |
| 2004/0229461 | A1* | 11/2004 | Darsillo | .................. C09G 1/02 438/689 |
| 2007/0293047 | A1* | 12/2007 | Fukushima | ............. B24B 37/04 438/692 |
| 2009/0215269 | A1* | 8/2009 | Boggs | ....................... C09G 1/02 438/693 |
| 2009/0246956 | A1* | 10/2009 | Takamiya | ................ C09G 1/02 438/693 |
| 2009/0289217 | A1* | 11/2009 | Sato | ......................... C09G 1/02 252/79.4 |
| 2009/0298289 | A1* | 12/2009 | Jeong | .................. H01L 21/3212 438/692 |
| 2010/0087065 | A1* | 4/2010 | Boggs | ....................... C09G 1/02 438/692 |
| 2010/0151684 | A1* | 6/2010 | Choi | ........................ C09G 1/02 438/693 |
| 2010/0184291 | A1* | 7/2010 | Shin | ........................ C09G 1/02 438/692 |
| 2011/0300778 | A1* | 12/2011 | Ono | ......................... C09G 1/02 451/36 |
| 2012/0024818 | A1* | 2/2012 | Ono | ..................... B24B 37/044 216/53 |
| 2013/0020283 | A1* | 1/2013 | Ono | ..................... B24B 37/044 216/53 |

FOREIGN PATENT DOCUMENTS

| CN | 1312843 A | 9/2001 |
| CN | 1610072 A | 4/2005 |
| CN | 1787895 A | 6/2006 |
| CN | 102318042 A | 1/2012 |
| KR | 20080023443 A | 3/2008 |
| KR | 20080094681 A | 10/2008 |
| KR | 20090093805 A | 9/2009 |
| KR | 20100022302 A | 3/2010 |
| KR | 20100063656 A | 6/2010 |
| KR | 20120077908 A | 7/2012 |
| TW | 201030134 A | 8/2010 |
| TW | 201148672 A | 5/2011 |

OTHER PUBLICATIONS

Chinese Office action and Search Report dated Feb. 1, 2016 for corresponding Chinese Patent Application No. 2013800690462; Noh, et al.

* cited by examiner

*Primary Examiner* — Allan Olsen
(74) *Attorney, Agent, or Firm* — Lee & Morse, P.C.

(57) ABSTRACT

The present invention relates to a CMP slurry composition for polishing copper, comprising: polishing particles; a complexing agent; a corrosion inhibitor; and deionized water. The complexing agent comprises one or more organic acids selected from oxalic acid, malic acid, malonic acid, and formic acid, and glycine.

10 Claims, No Drawings

CMP SLURRY COMPOSITION FOR POLISHING COPPER, AND POLISHING METHOD USING SAME

TECHNICAL FIELD

The present invention relates to a CMP slurry composition for polishing copper and a polishing method using the same. More particularly, the present invention relates to a CMP slurry composition used in polishing metal wires such as copper wires in semiconductor fabrication, and a polishing method using the same.

BACKGROUND ART

In fabrication of semiconductor devices, a CMP process is used in planarization of an insulating layer or metal layer on a wafer surface or wafer. The CMP process is a process in which a polishing pad is placed on a polishing platen, followed by application of a hydrostatic pressure while a polishing head holds and rotates a wafer during rotation of the polishing platen, thereby planarizing a wafer surface layer through polishing using mechanical polishing action by the polishing pad and a polishing agent of a polishing slurry composition and chemical polishing action by an oxidant of the polishing slurry composition. The polishing slurry composition used in CMP may include a polishing agent of metal oxide particles, deionized (DI) water in which the polishing agent is suspended; an oxidant removing a metal oxide by forming a passive layer on a surface of a metal film; a corrosion inhibitor preventing excessive corrosion by passivation, and a complexing agent chelating the metal oxide oxidized by the oxidant.

Since severe surface defects such as erosion and dishing occur in the process of polishing a metal layer, particularly a copper (Cu) layer, using a CMP slurry composition as compared with other metals, the corrosion inhibitor and the complexing agent are introduced.

As such, in the process of polishing the metal layer, particularly, the copper layer, it is necessary to secure a low level of surface defects along with an appropriate polishing rate. Otherwise, a polishing time becomes longer or surface defects can occur.

DISCLOSURE

Technical Problem

It is an aspect of the present invention to provide a CMP slurry composition for polishing copper, which can significantly reduce surface defects upon polishing of metal wires, particularly copper wires, and a polishing method using the same.

It is another aspect of the present invention to provide a CMP slurry composition for polishing copper, which can improve a polishing rate and polishing flatness, and a polishing method using the same.

Technical Solution

One aspect of the present invention relates to a CMP slurry composition for polishing copper. The composition includes polishing particles, an oxidant, a complexing agent, a corrosion inhibitor, and deionized water, wherein the complexing agent includes: at least one organic acid selected from oxalic acid, malic acid, malonic acid and formic acid; and glycine, and a weight ratio of the organic acid to glycine ranges from about 1:13 to about 1:260.

The complexing agent may be present in an amount of about 0.1% by weight (wt %) to about 15 wt % in the total weight of the composition.

The weight ratio of the organic acid to glycine may range from about 1:60 to about 1:200.

In one embodiment, the composition may further include a surfactant, a polymeric compound, a dispersant, a pH regulator, or combinations thereof.

The composition may include: about 0.01 wt % to about 20 wt % of the polishing particles; about 0.01 wt % to about 10 wt % of the oxidant; about 0.1 wt % to about 15 wt % of the complexing agent; about 0.001 wt % to about 10 wt % of the corrosion inhibitor; and the balance of deionized water.

The composition may have: about 1,200 or fewer surface defects as measured on a 12-inch copper blanket wafer after polishing for 30 seconds using a surface defect analyzer; and an LPC value of about 23,000 or less as measured using a macroparticle analyzer (Accusizer).

Another aspect of the present invention relates to a polishing method using the composition as set forth above. The method includes polishing copper wires using the composition.

Advantageous Effects

The present invention provides the CMP slurry composition for polishing copper, which can reduce surface defects and can improve a polishing rate and polishing flatness upon polishing of metal wires, particularly, copper wires.

BEST MODE

According to one embodiment of the present invention, a CMP slurry composition is used in a process of polishing metal wires, for example, copper wires, which are used as a conductive layer of semiconductor devices. The composition includes polishing particles, an oxidant, a complexing agent, a corrosion inhibitor and deionized water, and may further include a surfactant, a polymeric compound, a dispersant, a pH regulator or combinations thereof.

Hereinafter, each of the components will be described in detail.

Polishing Particles

According to the present invention, the CMP slurry composition may use metal oxide particles as the polishing particles. For example, the polishing particles may include silica ($SiO_2$), alumina ($Al_2O_3$), zirconia, molybdenum, ceria, and the like. These may be used alone or in combination thereof. Among these polishing particles, silica ($SiO_2$), particularly colloidal silica, may be advantageous for more effective polishing.

The colloidal silica polishing particles may have a different particle size depending on application purposes. For a low polishing rate for barriers and insulating layers, it is advantageous that the polishing particles are not agglomerated and have an average particle size of about 25 nm or less, and for a high polishing rate for the barriers and the insulating layers, it is advantageous that the polishing particles have a particle size of about 25 nm or more. If the polishing particles of about 25 nm or more are used in primary polishing (bulk copper polishing) corresponding to bulk polishing in copper wire polishing, erosion is increased due to an excessively high polishing rate for the barriers and the insulating layers. Although a process time should be reduced to overcome this problem, a defect rate can be increased due to generation of copper residues. In addition, if the polishing particles of about 25 nm or less are used in secondary polishing (barrier polishing) after primary polishing, since selectivity between copper and a heterogeneous film, that is, the insulating layer is increased, erosion and dishing can become severer as the polishing time is increased.

The polishing particles are present in an amount of about 0.01 wt % to about 20 wt % in the slurry composition. For example, the polishing particles may be present in an amount of about 0.01 wt % to about 20 wt % when the polishing particles are colloidal silica; the polishing particles may be present in an amount of about 0.05 wt % to about 20 wt % when the polishing particles are silica; and the polishing particles may be present in an amount of about 0.5 wt % to about 10 wt % when the polishing particles are alumina Within this range, the composition allows easy control of dispersion stability and the polishing rate.

Oxidant

The oxidant serves to promote chemical polishing by oxidizing a surface of a metal layer, for example, a copper layer, which is a polishing object.

According to the present invention, the oxidant may include inorganic and organic per-compounds, bromic acid and salts thereof, nitric acid and salts thereof, chloric acid and salts thereof, chromic acid and salts thereof, iodic acid and salts thereof, iron and salts thereof, copper and salts thereof, rare-earth metal oxides, transition metal oxides, potassium ferricyanide, potassium dichromate, and the like. Among these materials, the oxidant is preferably hydrogen peroxide. In order to obtain an appropriate polishing rate and to reduce corrosion or pitting upon polishing, the oxidant may be present in an amount of about 0.01 wt % to about 10 wt %, more effectively about 0.1 wt % to about 5 wt % in the slurry composition.

Complexing Agent

The complexing agent serves to chelate copper oxide oxidized by the oxidant. That is, the copper oxide oxidized by chelation with the copper oxide is suppressed from being re-adsorbed onto the copper layer, which is a polishing object, whereby a polishing rate for copper can be increased while reducing surface defects.

According to the present invention, the complexing agent includes a specific organic acid and a specific amino acid together.

The organic acid may be a dicarboxylic acid, and the dicarboxylic acid may include at least one selected from among oxalic acid, malic acid, malonic acid and formic acid. As such, since the copper oxide continuously generated during continuous CMP polishing can be continuously chelated by use of the specific organic acid, the copper oxide can be continuously suppressed from being re-adsorbed back onto the copper layer to be polished. Thus, the polishing rate for copper can be continuously increased while reducing surface defects. Therefore, it can be effectively achieved to prevent the polishing rate from decreasing or surface defects from generating during CMP.

The amino acid is glycine. If amino acids other than glycine are used there is a drawback of deterioration in copper polishing rate.

A weight ratio of the organic acid to glycine ranges from about 1:13 to about 1:260. If the weight ratio of the organic acid to glycine is less than about 1:13, the composition exhibits deterioration in polishing performance, and if the weight ratio of the organic acid to glycine is greater than about 1:260, corrosion occurs. Preferably, the weight ratio of the organic acid to glycine ranges from about 1:60 to about 1:200, more preferably from about 1:60 to about 1:100. Within this range, there is a merit in that an appropriate copper polishing rate, low surface defects and low LPC can be obtained.

In terms of polishing rate, dispersion stability of a slurry, surface properties of a polishing object, improvement in wafer profile and large-area planarization, the complexing agent is present in an amount of about 0.1 wt % to about 15 wt %, preferably about 0.1 wt % to about 10 wt % in the CMP slurry composition.

Corrosion Inhibitor

The corrosion inhibitor serves as a polishing regulator enabling polishing by allowing removal by physical action of the polishing particles in a high step height area in which polishing occurs, while delaying chemical reaction of the oxidant to suppress corrosion in a low step height area in which polishing does not occur. The corrosion inhibitor may include nitrogen-containing compounds, for example, ammonia, alkyl amines, amino acids, azoles, and the like. These may be used alone or in combination thereof. More effectively, the corrosion inhibitor is a compound including cyclic nitrogen compounds and derivatives thereof, and the corrosion inhibitor may be a compound that includes triazoles and derivatives thereof, and benzotriazole (BTA) and derivatives thereof. In one embodiment, the corrosion inhibitor may include an isomeric mixture of 1,2,3-triazole, 1,2,4-triazole or 2,2'-[[(5-methyl-1H-benzotriazole-1-yl)-methyl]imino]bis-ethanol. In terms of corrosion suppression, polishing rate, dispersion stability of the slurry composition and surface properties of a polishing object, the corrosion inhibitor is present in an amount of about 0.001 wt % to about 10 wt %, preferably about 0.001 wt % to about 5 wt %, more preferably about 0.001 wt % to about 3 wt % in the CMP slurry composition.

Deionized Water

The polishing particles are suspended in deionized water and thereby prepared into a slurry. The slurry is maintained at a pH of about 5 to about 9, preferably about 6 to about 8, through pH control.

In addition to the components as set forth above, the CMP slurry composition may further include a surfactant, a polymeric compound, a dispersant, a pH regulator, and the like.

According to the present invention, the CMP slurry composition may have about 1,200 or fewer surface defects, for example, about 100 to 1,150, as measured on a 12-inch copper blanket wafer after polishing for 30 seconds using a surface defect analyzer; and an LPC value of about 23,000 or less, for example, about 5,000 to about 22,500, as measured using a macroparticle analyzer (Accusizer).

In addition, the composition may have a polishing rate of about 4,000 Å/min to about 6,000 Å/min, as measured on a 12-inch copper blanket wafer after polishing for 30 seconds by the composition using a resistance meter (CMT-2000N, AIT Co., Ltd.).

Next, the present invention will be explained in more detail with reference to some examples. It should be understood that these examples are provided for illustration only and are not to be construed in any way as limiting the present invention.

A description of details apparent to those skilled in the art will be omitted for clarity.

EXAMPLES

Examples 1 to 3 and Comparative Examples 1 to 5

1.0 wt % of colloidal silica, 0.1 wt % of a benzotriazole derivative (1,2,3-triazole), 1.0 wt % of hydrogen peroxide and a complexing agent, which was composed of components added in amounts as listed in Table 1, were mixed with deionized water. Next, the slurry composition was adjusted to a pH of 7.0 using potassium hydroxide, thereby preparing a CMP slurry composition. Next, the CMP slurry composition was subjected to polishing evaluation as to the following properties.

Property Evaluation (1) Number of surface defects (ea): The number of surface defects was measured on a 12-inch copper blanket wafer after polishing for 30 seconds using a surface defect analyzer (LS-6800, Hitachi Co., Ltd.).

(2) Polishing rate (RR, Å/min): A polishing rate was measured by measuring a thickness change of the wafer removed by polishing. A Mirra polisher (AMAT Co., Ltd.) and an IC1010/SubaIV Stacked polishing pad (Rodel Co., Ltd.) were used. A 12-inch copper and PE-TEOS blanket wafer was used as a polishing object. Rotation speeds of a platen and a head were set to 93 rpm and 87 rpm, respectively; a hydrostatic pressure of the head was set to a down pressure of 2.65 psi; and a slurry flow rate was set to 250 ml/min. Measurement of the polishing rate after polishing corresponded to measurement of an amount of removed copper after polishing, and was performed using a CMT-2000N resistance meter (AIT Co., Ltd.). In addition, the polishing rate was measured at 49 points on the wafer, followed by calculation of an average value.

(3) LPC: LPC was measured under the condition of Dilution 10.

TABLE 1

| | Complexing agent | | Defect | RR | LPC |
|---|---|---|---|---|---|
| | Type | Amount | (ea) | (Å/min) | (ea) |
| Example 1 | Glycine/Oxalic acid | 6 wt %/0.03 wt % | 1123 | 5482 | 22457 |
| Example 2 | Glycine/Oxalic acid | 6 wt %/0.06 wt % | 1003 | 4936 | 17859 |
| Example 3 | Glycine/Oxalic acid | 6 wt %/0.1 wt % | 922 | 4504 | 15696 |
| Comparative Example 1 | Glycine | 6 wt % | 1423 | 5896 | 24783 |
| Comparative Example 2 | Glycine/Oxalic acid | 6 wt %/1 wt % | 1625 | 5690 | 26513 |
| Comparative Example 3 | Oxalic acid | 1 wt % | 1489 | 1740 | 19543 |
| Comparative Example 4 | Alanine/Oxalic acid | 6 wt %/0.1 wt % | 1542 | 2149 | 21648 |
| Comparative Example 5 | Glycine/Citric acid | 6 wt %/0.1 wt % | 1345 | 4107 | 20471 |

As shown in Table 1, it can be seen that the compositions of Examples 1 to 3 suppressed generation of surface defects as compared with the composition of Comparative Example 1 including the complexing agent using the amino acid alone. It can be seen that the composition of Comparative Example 1 including the complexing agent, which contained the organic acid and the amino acid in amounts out of the range according to the present invention, had increased surface defects and increased LPC.

Although the present invention has been described with reference to some embodiments, it should be understood that various modifications, changes, alterations, and equivalent embodiments can be made by those skilled in the art without departing from the spirit and scope of the invention. Therefore, the scope of the invention should be limited only by the accompanying claims.

The invention claimed is:

1. A CMP slurry composition for polishing copper, the CMP slurry composition comprising:
polishing particles,
an oxidant,
a complexing agent,
a corrosion inhibitor, and
deionized water,
wherein:
the complexing agent includes glycine and at least one organic acid selected from oxalic acid, malic acid, malonic acid, and formic acid;
a weight ratio of the organic acid to glycine ranges from about 1:13 to about 1:260; and
the CMP slurry composition has a pH of 5 to 9.

2. The CMP slurry composition according to claim 1, wherein the complexing agent is present in an amount of about 0.1 wt % to about 15 wt %, based on a total weight of the composition.

3. The CMP slurry composition according to claim 1, wherein the weight ratio of the organic acid to glycine ranges from about 1:60 to about 1:200.

4. The CMP slurry composition according to claim 1, further comprising a surfactant, a polymeric compound, a dispersant, a pH regulator, or combinations thereof.

5. The CMP slurry composition according to claim 1, wherein the CMP slurry composition includes:
about 0.01 wt % to about 20 wt % of the polishing particles;
about 0.01 wt % to about 10 wt % of the oxidant;
about 0.1 wt % to about 15 wt % of the complexing agent;
about 0.001 wt % to about 10 wt % of the corrosion inhibitor; and
a balance of deionized water, all wt % being based on a total weight of the composition.

6. A polishing method comprising: polishing copper wires using the composition as claimed in claim 1.

7. The CMP slurry composition according to claim 1, wherein the CMP slurry composition includes:
about 0.01 wt % to about 20 wt % of the polishing particles;
about 0.01 wt % to about 10 wt % of the oxidant;
about 0.1 wt % to about 15 wt % of the complexing agent;
about 0.001 wt % to about 10 wt % of the corrosion inhibitor; and
the deionized water, all wt % being based on a total weight of the composition.

8. The CMP slurry composition according to claim 1, wherein the CMP consists essentially of:
about 0.5 wt % to about 10 wt % of silica polishing particles;

about 0.1 wt % to about 5 wt % of hydrogen peroxide;
about 0.1 wt % to about 15 wt % of a mixture of the glycine and oxalic acid, the ratio of oxalic acid:glycine being about 1:60 to about 1:200;
about 0.001 wt % to about 3 wt % of a triazole;
a hydroxide base, the hydroxide base being present in an amount sufficient to adjust pH of the slurry composition to about 7; and
a balance of deionized water, all wt % being based on a total weight of the composition.

9. The CMP slurry composition according to claim 1, wherein the organic acid includes formic acid.

10. A CMP slurry composition, comprising:
about 0.5 wt % to about 10 wt % of silica polishing particles;
about 0.1 wt % to about 5 wt % of hydrogen peroxide;
about 0.1 wt % to about 15 wt % of a mixture of the glycine and oxalic acid, a ratio of oxalic acid:glycine being about 1:60 to about 1:200;
about 0.001 wt % to about 3 wt % of a triazole;
a hydroxide base, the hydroxide base being present in an amount sufficient to adjust pH of the slurry composition to about 7; and
a balance of deionized water, all wt % being based on a total weight of the composition.

* * * * *